United States Patent
Headley et al.

(10) Patent No.: US 6,881,610 B2
(45) Date of Patent: Apr. 19, 2005

(54) METHOD AND APPARATUS FOR PREPARING A PLURALITY OF DICE IN WAFERS

(75) Inventors: William R. Headley, Santa Clara, CA (US); Mario J. Paniccia, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/335,796

(22) Filed: Jan. 2, 2003

(65) Prior Publication Data

US 2004/0130001 A1 Jul. 8, 2004

(51) Int. Cl.[7] .......................... H01L 21/44; H01L 21/46
(52) U.S. Cl. ...................................... 438/113; 438/460
(58) Field of Search .................................. 438/113, 460

(56) References Cited

U.S. PATENT DOCUMENTS

| | | | | |
|---|---|---|---|---|
| 5,904,546 A | * | 5/1999 | Wood et al. | 438/460 |
| 6,075,280 A | * | 6/2000 | Yung et al. | 257/620 |
| 6,528,864 B1 | * | 3/2003 | Arai | 257/620 |
| 6,642,127 B1 | * | 11/2003 | Kumar et al. | 438/460 |
| 6,646,292 B1 | * | 11/2003 | Steigerwald et al. | 257/103 |
| 6,777,715 B1 | | 8/2004 | Geusic et al. | |

FOREIGN PATENT DOCUMENTS

JP  05277793 (7-106285)  * 4/1995  ........... H01L/21/78

OTHER PUBLICATIONS

Stanley Wolf Silicon Processing for the VSLI Era vol. 2 Lattice Press 1986 p. 55.*

* cited by examiner

*Primary Examiner*—David S. Blum
(74) *Attorney, Agent, or Firm*—Blakely, Sokoloff, Taylor & Zafman LLP

(57) ABSTRACT

An apparatus and method for preparing a plurality of dice on a semiconductor wafer. In one embodiment, a method according to embodiments of the present invention includes arranging a plurality of dice in a semiconductor wafer such that there is a separation region between each neighboring die of the semiconductor wafer. One or more trenches are etched in the separation region of the semiconductor wafer to form one or more lateral surfaces of one or more of the plurality of dice. The semiconductor wafer is then fractured into separate pieces at the one or more trenches to separate the plurality of dice from each other.

13 Claims, 5 Drawing Sheets

METHOD AND APPARATUS FOR PREPARING A PLURALITY OF DICE IN WAFERS

BACKGROUND OF THE INVENTION

1. Field of the Invention

The present invention relates generally to semiconductor processing and, more specifically, the present invention relates to preparing a plurality of dice from a semiconductor wafer.

2. Background Information

A variety of products may be fabricated from semiconductor wafers such as for example integrated circuits, optical devices, etc. A plurality of dice are typically arranged on a wafer when fabricated and then the dice are eventually separated into individual dice at some point during the process. For optical devices, additional processing steps are typically involved.

For example, after an optical device wafer is finished processing, each die usually must undergo several more steps before it can be packaged or tested. The first step is to liberate each die by dicing up the wafer. Dicing has a serious issue in that it can cause chipping of the die, which can destroy optical waveguides on the die. It also leaves the facets of the waveguide too rough to adequately pass light.

Next the die is removed from the wafer and the edges of the die that are perpendicular to the waveguides are polished. The reason for the polish is to obtain an optically smooth surface at the inputs and outputs of the optical waveguides. These interfaces must be smooth, as any roughness will contribute to the optical loss of the device. Mechanical polishing has several major drawbacks. The first is that it is very time consuming, typically taking anywhere from 1–3 hours to polish a single die. Also, the polishing exerts a force on the optical waveguides that can cause them to chip or break, causing the yield of devices per die to decrease.

Once polished the die are manually cleaned. This is another step that can cause the optical waveguides to chip or break. It is also difficult to determine if the optical waveguides are truly clean as they are on the order of only a few microns. A microscope could be used to examine each and every waveguide, however, the throughput time would become astronomical as there are typically many optical waveguides on a single die.

In some instances, the devices are then anti-reflection (AR) coated to reduce reflections at the inputs and outputs of optical waveguides due to their interface with air. If the devices are not properly cleaned, the AR coating will not stick. If the AR coating does not stick, not only will the AR coating not help in reducing the reflectivity, but the lack of the AR coating sticking may also induce optical scattering which will cause the optical loss to be higher than if the AR coating wasn't there at all.

BRIEF DESCRIPTION OF THE DRAWINGS

The present invention is illustrated by way of example and not limitation in the accompanying figures.

DETAILED DESCRIPTION

Methods and apparatuses for modulating an optical beam in an optical device are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

In one embodiment of the present invention, improved techniques for preparing wafers of having a plurality of dice are disclosed. In one embodiment, the plurality of dice are arranged on a silicon-on-insulator (SOI) wafer and at least some of the dice include photonic devices such as for example waveguides having facets along the edges of the dice. As will be discussed, the dice are separated by fracturing the wafers in separation regions that are deep trenched etched according to embodiments of the present invention. In addition, the wafers are anti-reflection (AR) coated prior to fracturing the wafers such that the facets of any waveguides along the edges of the dice have reduced reflections.

Figure 1:
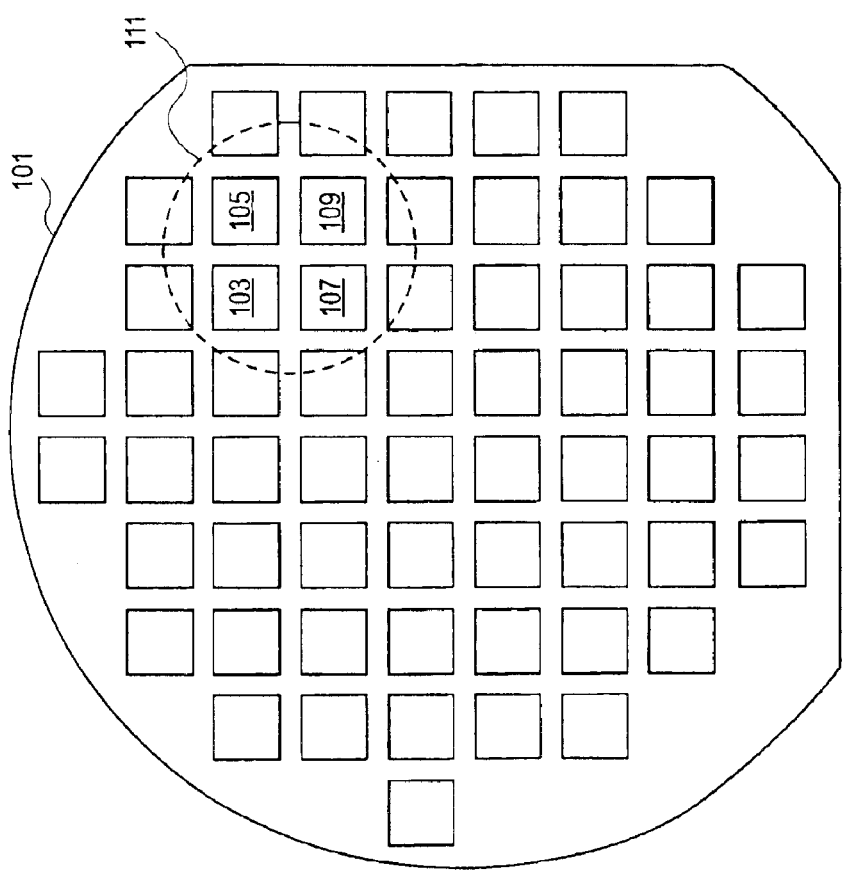
FIG. 1 is a diagram illustrating one embodiment of a semiconductor wafer including a plurality of dice in accordance with the teachings of the present invention.

To illustrate, FIG. 1 is a diagram illustrating one embodiment of a semiconductor wafer including a plurality of dice in accordance with the teachings of the present invention. For instance, FIG. 1 shows a semiconductor wafer 101 including a plurality of dice arranged thereon. In region 111 of semiconductor wafer 101, a plurality of dice 103, 105, 107 and 109 are illustrated for explanation purposes.

Figure 2:
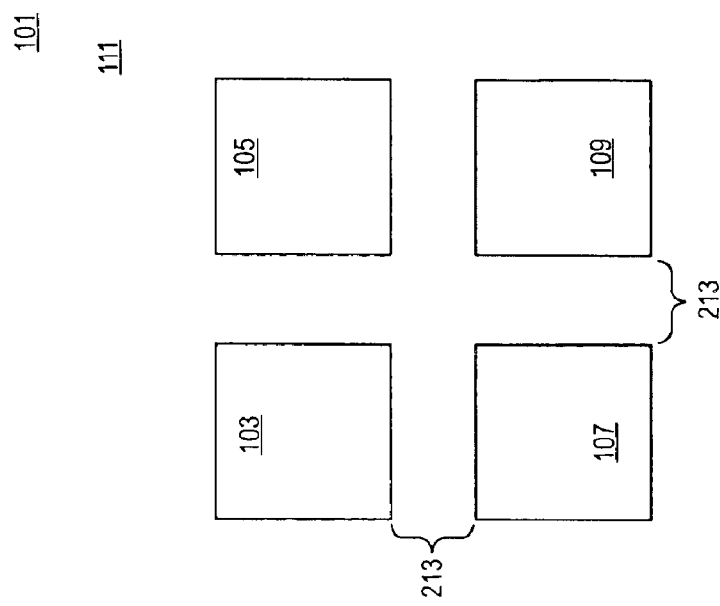
FIG. 2 is a diagram showing additional detail of one embodiment of a semiconductor wafer including a plurality of dice in accordance with the teachings of the present invention.

FIG. 2 is a diagram illustrating one embodiment of region 111 of semiconductor wafer 101 in greater detail. As shown, dice 103, 105, 107 and 109 are arranged in semiconductor wafer 101. FIG. 2 also shows that there is a separation region 213 a region between each of the dice in semiconductor wafer 101. In particular, separation region 213 is between dice 103 and 107, 105 and 109, 103 and 105 and 107 and 109 in FIG. 2. In short, separation region 213 is between each neighboring die of semiconductor wafer 101.

In one embodiment, semiconductor wafer 101 is an optical device wafer on which photonic devices including optical waveguides are fabricated in one or more of the plurality of dice. As will be discussed, semiconductor wafer 101 will therefore ultimately be separated into multiple pieces so as to liberate each of the plurality of dice during processing. In addition, each of the plurality of dice may also be AR coated so as to reduce reflections occurring at any of the facets of waveguides disposed along lateral surfaces of the plurality of dice.

Figure 3:
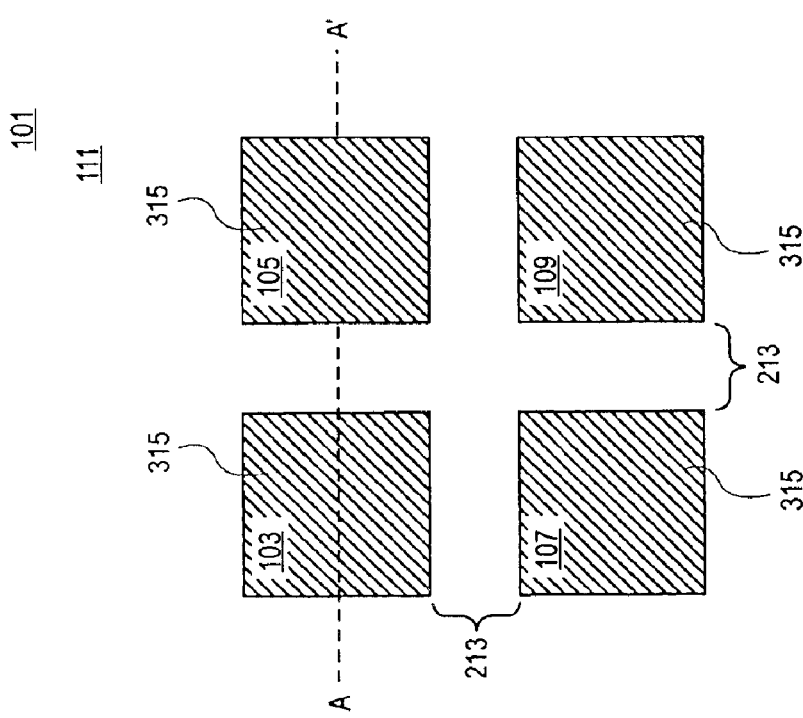
FIG. 3 is a diagram showing one embodiment of a semiconductor wafer including a plurality of dice on which a mask is patterned and separation regions are exposed in accordance with the teachings of the present invention.

To illustrate, FIG. 3 shows an embodiment of the present invention in which a mask 315 is patterned over each of the plurality of dice 103, 105, 107 and 109 of semiconductor wafer 101. As shown in the depicted embodiment, mask 315 is patterned such that each of the plurality of dice 103, 105, 107 and 109 is covered, but that separation region 213 between each neighboring die of semiconductor wafer 101 is left exposed. In one embodiment, mask 315 is created by exposing via photolithography an applied global coating of a photoresist material or the like across each die of semiconductor wafer 101, but leaving the separation regions unexposed. The semiconductor wafer 101 is then chemically treated to remove the unexposed mask material 315 in the separation region 213.

Figure 4:
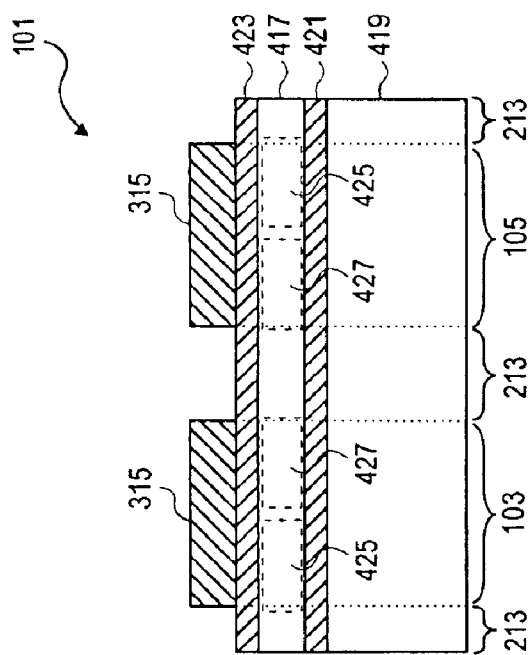
FIG. 4 is a cross-section diagram illustrating one embodiment of a semiconductor wafer including a plurality of dice on which a mask is patterned and separation regions are exposed in accordance with the teachings of the present invention.

FIG. 4 is a diagram illustrating one embodiment of a cross-section of semiconductor wafer 101 along dashed line A-A' of FIG. 3. As shown in FIG. 4, mask 315 is patterned over semiconductor wafer 101 so as to cover dice 103 and 105 and leave separation region 213 exposed. In the embodiment depicted in FIG. 4, semiconductor wafer 101 is a silicon-on-insulator (SOI) wafer. It is appreciated that in other embodiments, other materials and/or other types of wafers may be utilized in accordance with the teachings of the present invention.

With respect to the specific embodiment depicted in FIG. 4, semiconductor wafer includes a semiconductor layer 417 and a semiconductor layer 419 separated by a buried oxide layer 421. In one embodiment, semiconductor-based optical waveguides 425 and/or other devices of interest 427 are disposed in semiconductor layer 417. In one embodiment, waveguides 425 may be rib waveguides, strip waveguides or the like formed in silicon and therefore have silicon cores. In one embodiment, the other devices of interest 427 may include one or more of other photonic devices, couplers, filters, photodiodes, switches or the like or circuit devices such as transistors, diodes, resistors, capacitors or the like. In one embodiment, metal layers of interconnects may be disposed in additional oxide layer 423, which is disposed proximate to semiconductor layer 417. In one embodiment, oxide layer 423 and buried oxide layer 421 also serve as layers of cladding materials to help to confine light within optical waveguides 425. Indeed, in one embodiment, oxide layer 423 and buried oxide layer 421 are made of insulating materials or other suitable equivalents having a refractive index that is less than the refractive index of semiconductor layer 417.

Figure 5:
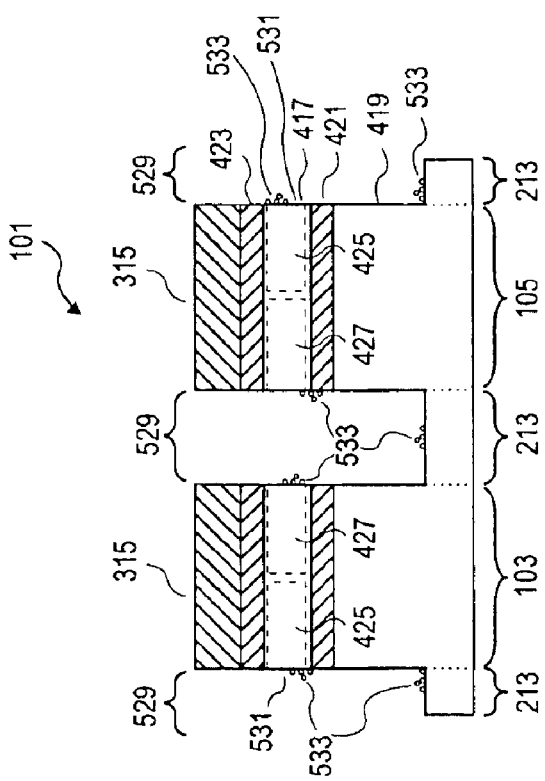
FIG. 5 is a cross-section diagram illustrating one embodiment of a semiconductor wafer including a plurality of dice after a deep trench etch is performed in the exposed separation regions in accordance with the teachings of the present invention.

FIG. 5 is a diagram illustrating one embodiment of a cross-section of semiconductor wafer 101 after a deep trench is performed in accordance with the teachings of the present invention. As shown in the depicted embodiment, a deep trench etch is performed in the unmasked separation regions 213. In one embodiment, the deep trench is performed such that one or more trenches 529 are formed in semiconductor wafer 01. As shown in FIG. 5, trenches 529 are etched into semiconductor wafer 101 to depth greater than a depth of devices of interest 427 and/or waveguides 425. As will be discussed below, trenches 529 in one embodiment may act is scribe lines in semiconductor wafer 101 such that the plurality of dice may be liberated from each other later by fracturing semiconductor wafer 101. In an alternate embodiment, traditional dicing or sawing techniques may be employed in trenches 529 to liberate the plurality of dice of semiconductor wafer 101 from each other. After the etching illustrated in the embodiment FIG. 5, lateral surfaces are then formed along the sides of the dice 103 and 105 of semiconductor wafer 101. As shown in the illustrated embodiment, one or more facets 531 are therefore formed in waveguides 425 as a result of the etching in trenches 519 along the lateral surfaces of dice 103 and 105 of FIG. 5. It is appreciated that since the one or more facets 531 are formed as a result of deep etch trenching in accordance with the teachings of the present invention instead of by traditional dicing or sawing techniques, mechanical polishing is no longer required. In one embodiment, the facet quality may then be improved by oxide smoothing, which in one embodiment includes growing a thin sacrificial oxide over the facet surface. The growth of the oxide consumes some of the silicon but leaves a smoother surface when the oxide is removed.

Therefore, the overall time to process semiconductor wafer 101 is reduced. In addition, chipping or other damage that may occur as a consequence of the traditional mechanical techniques described above are no longer a concern and yields are increased in accordance with the teachings of the present invention.

In one embodiment, it is appreciated that trenches 529 may be formed as a result of multiple etches. For instance, in one embodiment, a first etch of semiconductor wafer 101 results in oxide layer 423 and semiconductor layer 417 being etched away and removed down to buried oxide layer 421. A subsequent etch removes the buried oxide layer 421. Finally, another etch in one embodiment removes approximately 50–100 $\mu$m so that for example an optical fiber could be butt-coupled to facet 531 of waveguide 425. In other embodiments, it is appreciated that other etching procedures may be employed in accordance with the teachings of the present invention so long trenches 529 are formed and are trenched down to a depth in semiconductor wafer 101 to a depth greater than the depth of devices of interest in semiconductor wafer 101.

FIG. 5 shows that in one embodiment, debris 533 may remain on semiconductor wafer 101 after etching.

Figure 6:
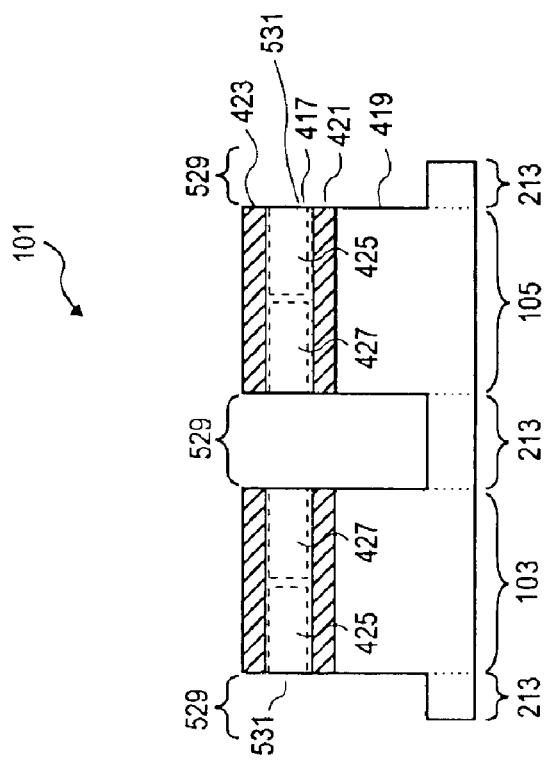
FIG. 6 is a cross-section diagram illustrating one embodiment of a semiconductor wafer including a plurality of dice after the wafer is cleaned in accordance with the teachings of the present invention.

Accordingly, FIG. 6 is a cross-section diagram of semiconductor wafer 101 that shows that after cleaning, debris 533 and mask 315 is removed from semiconductor wafer 101 in accordance with the teachings of the present invention. Well known wafer cleaning techniques may be employed to removed debris 533 and mask 315 from semiconductor wafer 101 such that subsequent coatings may be applied to semiconductor wafer 101 with adequate adhesion.

Figure 7:
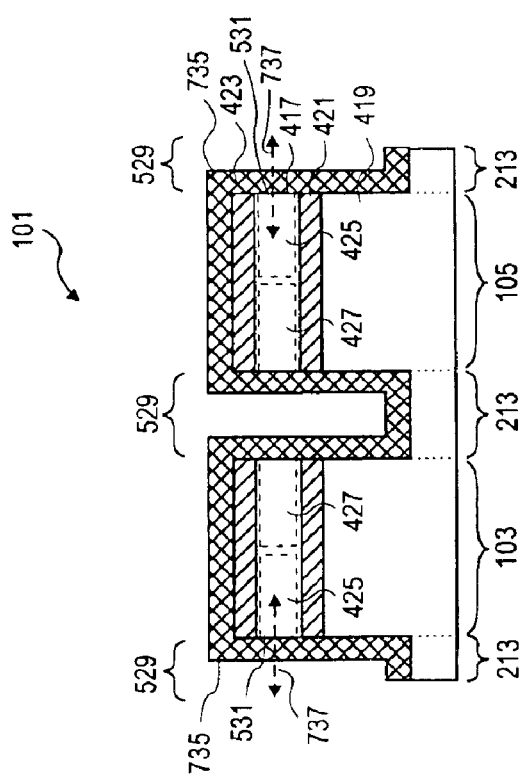
FIG. 7 is a cross-section diagram illustrating one embodiment of a semiconductor wafer including a plurality of dice including an anti-reflective (AR) coating that is applied over an entire surface of the wafer in accordance with the teachings of the present invention.

To illustrate, FIG. 7 is a cross-section diagram showing one embodiment of semiconductor wafer 101 including an AR coating that is applied over an entire surface of the semiconductor wafer 101 in accordance with the teachings of the present invention. In the depicted embodiment, FIG. 7 shows that AR coating 735 is applied over the entire front side surface of semiconductor wafer 101 such that the plurality of dice, including dice 103 and 105, oxide layer 423 and trenches 529 are covered with AR coating 735. In one embodiment, AR coating 735 is applied to the entire front side surface of semiconductor wafer 101 in a single application. As shown in FIG. 7, by covering trenches 529 with AR coating 735, facets 531 of waveguides 425 are also coated with AR coating 735. With AR coating 735, an optical beam 737 may be directed through waveguide 425 and facet 531 with reduced reflections when compared to directing optical beam 737 through a semiconductor material/air interface without AR coating 735.

Figure 8:
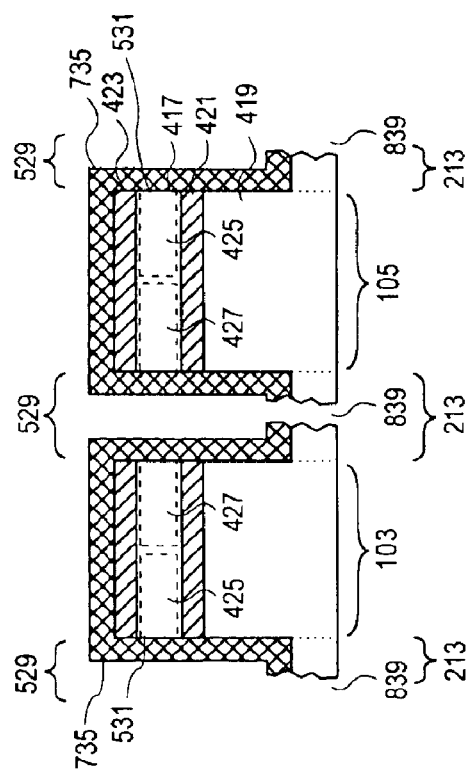
FIG. 8 is a cross-section diagram illustrating one embodiment of a semiconductor wafer including a plurality of dice that has been fractured in the separation regions to liberate each of the plurality of dice in accordance with the teachings of the present invention.

FIG. 8 is a cross-section diagram illustrating one embodiment of semiconductor wafer 101 that has been separated or fractured along the trenches 529 in separation regions 213 so as to liberate each of the plurality of dice in accordance with the teachings of the present invention. For example, in the embodiment shown in FIG. 7, semiconductor wafer 101 is cleaved, cracked, broken, diced, etc., after AR coating 735 is applied such that fractures 839 in separation region 213 are formed to separate the plurality of dice from each other, including separating die 103 from die 105.

As shown in FIG. 7, a portion of the separation region 213 remains with each of the dice. The fractures 839 in separation region 213 are partially covered with AR coating 735, but the sides or lateral portions of fractures 839 are not covered with AR coating 735 since this is where the fractures or dicing has occurred after the AR coating 735 is applied to physically separate the plurality of dice from each other. As can be appreciated, since trenches 529 were formed in semiconductor wafer 101 with deep trench etching to a depth greater than a depth greater than waveguides 425 and/or other devices of interest 427, waveguides 425 and/or other devices of interest 427 are not damaged or destroyed as a consequence of fractures 839 in separation region 213 in accordance with the teachings of the present invention.

It is appreciated that even though fractures 839 in separation regions 213 are not fully covered with AR coating 735 since the fractures 839 in separation region 213 are formed after AR coating 735, facets 531 of waveguides 425 are still adequately coated with AR coating 735 to reduce reflections. In addition, it is appreciated that since oxide layer 423 is disposed between AR coating 735 and waveguide 425, adequate cladding is provided for waveguide 425 such that an optical beam directed through waveguide 425 is confined to remain with waveguide 425 until facet 531 is reached.

Figure 9:
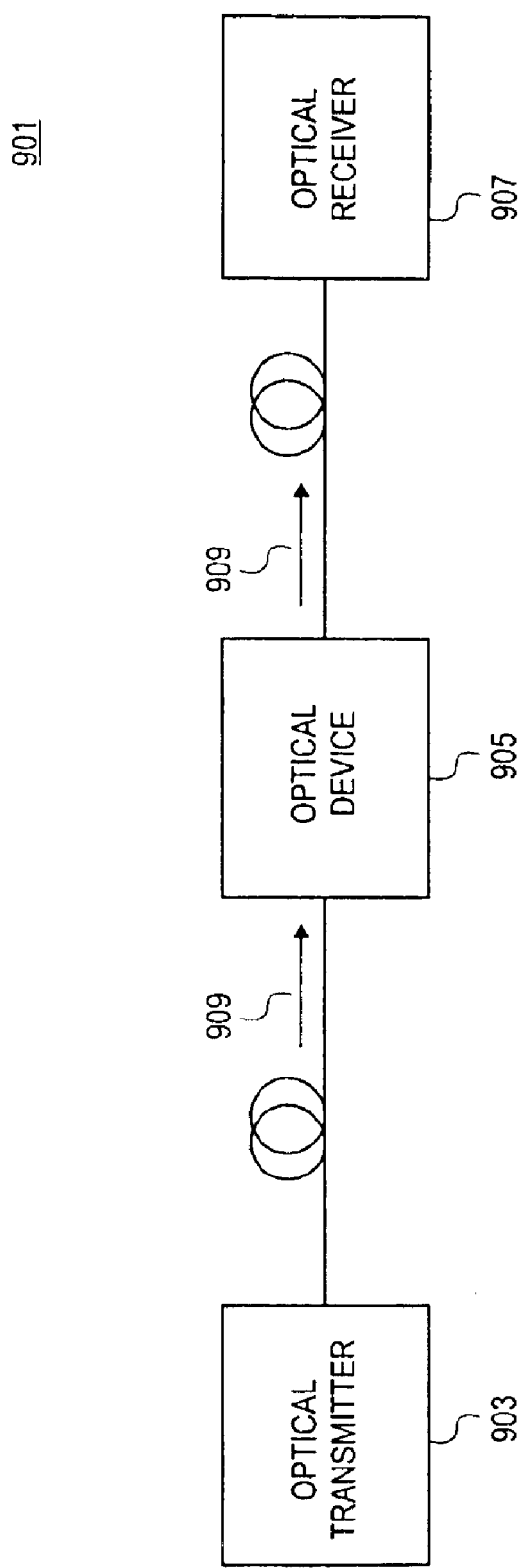
FIG. 9 is a block diagram illustrating a system including an optical transmitter coupled to an optical receiver through an optical device in accordance with the teachings of the present invention.

In one embodiment, after the plurality of dice are liberated, each of the dice may then be packaged and may for example be employed in larger systems. To illustrate, FIG. 9 is a block diagram illustrating a system including an optical transmitter coupled to an optical receiver through an optical device in accordance with the teachings of the present invention. In particular, FIG. 9 shows optical system 901 including an optical transmitter 903 and an optical receiver 907. In one embodiment, optical system 901 also includes an optical device 905 optically coupled between optical transmitter 903 and optical receiver 907. As shown in FIG. 9, optical transmitter 903 transmits an optical beam 909 that is received by optical device 905. In one embodiment, optical device 905 may include a die such as for example die 103, 105, 107 or 109 that is fabricated in accordance with the embodiments discussed above. Accordingly, in one embodiment, optical device 905 may include a die 103 including a waveguide 425 with a facet 531 over which an AR coating 735 is applied to reduce reflections in accordance with the teachings of the present invention. In one embodiment, the other devices of interest 427 in die 103 may for example perform some type of optical processing on optical beam 909, which is then output from optical device 905 and then coupled to be received by optical receiver 907.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method, comprising:
   arranging a plurality of dice in a semiconductor wafer such that there is a separation region between each neighboring die of the semiconductor wafer;
   etching one or more trenches in the separation region of the semiconductor wafer to form one or more lateral surfaces on one or more of the plurality of dice;
   forming one or more facets in an optical waveguide included in one of the plurality of dice prior to separating the plurality of dice by etching the one or more trenches in the separation region; and
   separating the semiconductor wafer into separate pieces at the one or more trenches to separate the plurality of dice from each other.

2. The method of claim 1 further comprising oxide smoothing the one or more facets prior to separating the semiconductor wafer into pieces, to improve facet quality of the one or more facets.

3. The method of claim 1 further comprising cleaning the wafer, after forming the one or more facets and prior to separating the semiconductor wafer into pieces, to clean the one or more facets.

4. The method of claim 1 further comprising coating the semiconductor wafer with an anti-reflective (AR) coating, after forming the facet and prior to separating the semiconductor wafer into pieces, to AR coat the facet.

5. The method of claim 4 wherein coating the semiconductor wafer with the AR coating is performed without polishing the one or more, facets.

6. The method of claim 1 wherein etching the one or more trenches in the separation region comprises etching through a buried oxide layer included in the semiconductor wafer prior to separating the plurality of dice.

7. The method of claim 1 wherein etching the one or more trenches in the separation region of the semiconductor wafer comprises etching the one or more trenches to a depth greater than a depth of devices of interest in the plurality of dice in the semiconductor wafer.

8. The method of claim 1 further comprising patterning a mask on the semiconductor wafer so as to expose portions of the separation region between each neighboring die of the semiconductor wafer such that the one or more trenches are etched into the exposed portions of the separation region between each neighboring die of the semiconductor wafer.

9. The method of claim 1 wherein separating the semiconductor wafer into separate pieces comprises fracturing the semiconductor wafer in the one or more trenches to separate the plurality of dice from each other.

10. The method of claim 1 wherein separating the semiconductor wafer into separate pieces comprises dicing the semiconductor wafer in the one or more trenches to separate the plurality of dice from each other.

11. A method, comprising:
arranging a plurality of dice in a semiconductor wafer such that there is a separation region between each neighboring die of the semiconductor wafer;
etching one or more trenches in the separation region of the semiconductor wafer to a depth greater than a depth of devices of interest in the plurality of dice in the semiconductor wafer to form one or more lateral surfaces on one or more of the plurality of dice, the one or more trenches being substantially rectangular below the devices of interest in the plurality of dice; and
separating the semiconductor wafer into separate pieces at the one or more trenches to separate the plurality of dice from each other.

12. The method of claim 11 further comprising cleaning the wafer, after forming the one or more facets and prior to separating the semiconductor wafer into pieces, to clean the one or more facets.

13. The method of claim 12 further comprising coating the semiconductor wafer with an anti-reflective (AR) coating, after forming the facet and prior to separating the semiconductor wafer into pieces, to AR coat the facet.

* * * * *